_(12)_ United States Patent
Yamamoto (10) Patent No.: US 7,335,605 B2
(45) Date of Patent: Feb. 26, 2008

(54) PROTECTIVE TAPE APPLYING AND SEPARATING METHOD

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 397 days.

(21) Appl. No.: 10/541,158

(22) PCT Filed: Dec. 22, 2003

(86) PCT No.: PCT/JP03/16503

§ 371 (c)(1),
(2), (4) Date: Jun. 30, 2005

(87) PCT Pub. No.: WO2004/079817

PCT Pub. Date: Sep. 16, 2004

(65) Prior Publication Data

US 2006/0089004 A1    Apr. 27, 2006

(30) Foreign Application Priority Data

Mar. 5, 2003    (JP) ............................. 2003-058518

(51) Int. Cl.
*H01L 21/469*   (2006.01)
*H01L 21/31*    (2006.01)
*H01L 21/461*   (2006.01)
*H01L 21/78*    (2006.01)
*H01L 21/46*    (2006.01)
*H01L 21/301*   (2006.01)

(52) U.S. Cl. ..................... 438/759; 438/976; 438/690; 438/761; 438/465

(58) Field of Classification Search ........ 438/690–691, 438/465, 758–759, 761, 976
See application file for complete search history.

(56) References Cited

U.S. PATENT DOCUMENTS

| | | | | |
|---|---|---|---|---|
| 5,981,391 A * | 11/1999 | Yamada | ....................... | 438/690 |
| 6,638,837 B1 * | 10/2003 | Tsao et al. | ................... | 438/459 |
| 6,864,154 B2 * | 3/2005 | Yoon et al. | ................... | 438/459 |
| 2003/0062116 A1 | 4/2003 | Lee | | |
| 2003/0064592 A1 | 4/2003 | Yamamoto | | |

FOREIGN PATENT DOCUMENTS

| | | |
|---|---|---|
| JP | 2000-331968 A | 11/2000 |
| JP | 2001-063908 A | 3/2001 |
| JP | 2003-151930 A | 5/2003 |

OTHER PUBLICATIONS

PCT International Search Report for PCT/JP03/16503 mailed on Apr. 13, 2004.

* cited by examiner

*Primary Examiner*—Luan Thai
(74) *Attorney, Agent, or Firm*—Cheng Law Group PLLC (57) ABSTRACT

In a protective tape applying and separating method according to this invention, a protective tape applied by a tape applying mechanism to a surface of a wafer suction-supported by a chuck table is cut to a wafer configuration by a cutter unit. Subsequently, a protective tape having a weaker adhesion than the first protective tape is applied to the protective tape. The protective tapes forming plies are separated one by one, the upper one first, by a tape separating apparatus 15 after a thinning process of the wafer.

17 Claims, 5 Drawing Sheets

PROTECTIVE TAPE APPLYING AND SEPARATING METHOD

TECHNICAL FIELD

This invention relates to a technique for applying protective tape to surfaces of semiconductor wafers with an electric circuit pattern or the like formed thereon and for separating the protective tape.

BACKGROUND ART

In a conventional process of manufacturing semiconductor wafers, a mechanical method such as grinding or polishing, or a chemical method using etching, is used to process the back surfaces of semiconductor wafers (hereinafter simply called "wafers") to reduce the thickness thereof. When these methods are used to process the wafers, protective tape is applied to the front surfaces of the wafers in order to protect the front surfaces having wiring patterns formed thereon.

Thus, a wafer sent to a back-grinding process is suction-supported at the front surface (patterned surface) by a chuck table and the back surface is ground with a grinder. At this time, protective tape is applied to the front surface of the wafer since the pattern could be damaged under the stress of grinding occurring to the front surface or could be contaminated.

The wafer thinned by grinding of its back surface could easily be broken during the processing or transportation. The wafer, due to its deflection or bending, is difficult to handle. In order to avoid such inconveniences, a proposal has been made to apply two different types of protective tape to a wafer surface beforehand to prevent damage and bending of the wafer (see Japanese Unexamined Patent Publication 2000-331968).

Thus, a method has been proposed and implemented to separate in a separating step, all at a time, the two protective tapes applied to the surface of the wafer.

The use of protective tape in double plies as described in the above Japanese Unexamined Patent Publication 2000-331968 has an advantage in terms of wafer reinforcement, but has the following inconvenience encountered in the process of separating the protective tape.

When separating the protective tape in two plies all at once, a very strong separating force (pulling force) is applied at this time. Thus, the very strong pulling force applied at a time to the thinned wafer poses a problem of forcibly bending or damaging the wafer.

DISCLOSURE OF THE INVENTION

This invention has been made having regard to the state of the art noted above, and its primary object is to provide a protective tape applying and separating method capable of reinforcing semiconductor wafers by giving rigidity thereto, and separating protective tape from the wafers with high precision.

To fulfill the above object, this invention employs the following composition.

A protective tape applying and separating method for applying protective tape to a surface of a semiconductor wafer with a pattern formed thereon, and separating the protective tape from the surface of the semiconductor wafer, said method comprising an applying step for applying a plurality of protective tapes in plies to the surface of said semiconductor wafer such that a protective tape with weak adhesion lies on top, and a separating step for applying a separator tape over said protective tapes applied in plies, and separating the protective tapes in plies one by one, the upper one first, from the surface of said semiconductor wafer by means of the separator tape.

According to this invention, protective tapes are applied in plies, with a protective tape of weak adhesion lying on top, to the surface of the semiconductor wafer. Thus, in time of thinning process for grinding the semiconductor wafer, rigidity is given to the semiconductor wafer being processed. As a result, damage to the semiconductor wafer may be prevented.

In time of separating the protective tapes, only one protective tape to which the separating tape is applied for separation is separated with the separating tape, since the upper protective tape is weaker in adhesion than the lower protective tape. That is, the protective tapes are separated in order from the semiconductor wafer with the lower protective tape applied thereto. The protective tapes are separated in order, the upper one first, while the protective tape maintains rigidity for the semiconductor wafer after a thinning process. As a result, compared with separating all the protective tapes applied in plies in one separating operation, the stress applied to the semiconductor wafer by a pulling force in time of separation is reduced, thereby to prevent bending of and damage to the semiconductor wafer.

The protective tapes applied to the surface of the semiconductor wafer may, for example, comprise a plurality of protective tapes bonded together in plies as a unit beforehand. That is, the protective tapes bonded together in plies as a unit beforehand in one attaching operation may be applied to the semiconductor wafer, to realize an improvement in working efficiency. In time of separating the protective tapes, the protective tapes in plies are separated one by one, the upper one first, which produces the same effect as noted above.

The protective tapes in plies may, for example, be a plurality of protective tapes applied individually and repeatedly. By applying a plurality of protective tapes individually and repeatedly to the surface of the semiconductor wafer, the protective tapes may be applied to the semiconductor wafer with a reduced pressure level of the protective tapes. As a result, an accumulation of stress due to the pressure to the semiconductor wafer may be reduced. It is also possible to prevent bending of the semiconductor wafer after a thinning process, damage caused by such bending, and a transport error due to an insufficient suction of the semiconductor wafer.

Preferably, the protective tapes in plies have adhesive-contacting surfaces given release treatment. By giving release treatment to the adhesive-contacting surfaces of the protective tapes, the protective tapes in plies may easily be separated one by one, the upper one first. As a result, the pulling force acting in time of separating the protective tapes may be reduced.

The protective tapes may be in sheet form, which are first applied to the semiconductor wafer, and thereafter cut approximately to the shape of the semiconductor wafer, or may be cut approximately to the shape of the semiconductor wafer beforehand.

To fulfill the foregoing object, this invention employs the following construction also.

A protective tape applying and separating method for applying protective tape to a surface of a semiconductor wafer with a pattern formed thereon, and separating the protective tape from the surface of the semiconductor wafer, said method comprising an applying step for applying a plurality of protective tapes of the same type with adhesive-contacting surfaces given release treatment, in plies to the surface of said semiconductor wafer, and a separating step for applying a separator tape over said protective tapes applied in plies, and separating the protective tapes in plies one by one, the upper one first, from the surface of said semiconductor wafer by means of the separator tape.

According to this invention, a plurality of protective tapes of the same type with adhesive-contacting surfaces given release treatment are applied in plies to the surface of the semiconductor wafer. Thus, when separating the protective tapes with a separator tape applied to the protective tapes in plies, the protective tape to be separated is easily separated from the surface of the lower protective tape. Since the protective tapes may be separated one by one, the upper one first, compared with separating all the protective tapes applied in plies in one separating operation, the stress applied to the semiconductor wafer by a pulling force in time of separation is reduced, thereby to prevent bending of and damage to the semiconductor wafer.

The protective tapes applied to the surface of the semiconductor wafer may comprise a plurality of protective tapes bonded together in plies as a unit beforehand. That is, the protective tapes bonded together in plies as a unit beforehand in one attaching operation may be applied to the semiconductor wafer, to realize an improvement in working efficiency. In time of separating the protective tapes, the protective tapes in plies are separated one by one, the upper one first, which produces the same effect as noted above.

The protective tapes in plies may be a plurality of protective tapes applied individually and repeatedly. By applying a plurality of protective tapes individually and repeatedly to the surface of the semiconductor wafer, the protective tapes may be applied to the semiconductor wafer with a reduced pressure level of the protective tapes. As a result, an accumulation of stress in the semiconductor wafer may be reduced. It is also possible to prevent bending of the semiconductor wafer after a thinning process, damage caused by such bending, and a transport error due to an insufficient suction of the semiconductor wafer.

The protective tapes may be in sheet form, which are first applied to the semiconductor wafer, and thereafter cut approximately to the shape of the semiconductor wafer, or may be cut approximately to the shape of the semiconductor wafer beforehand.

BEST MODE FOR CARRYING OUT THE INVENTION

Modes for solving the problem of the prior art include the following.

A preferred embodiment in which this invention is applied to protective tape applying and separating apparatus will be described hereinafter with reference to the drawings.

Protective Tape Applying Method

Before describing a protective tape applying method in this embodiment, a tape applying apparatus used in this embodiment will be described with reference to the drawings.

Figure 1:
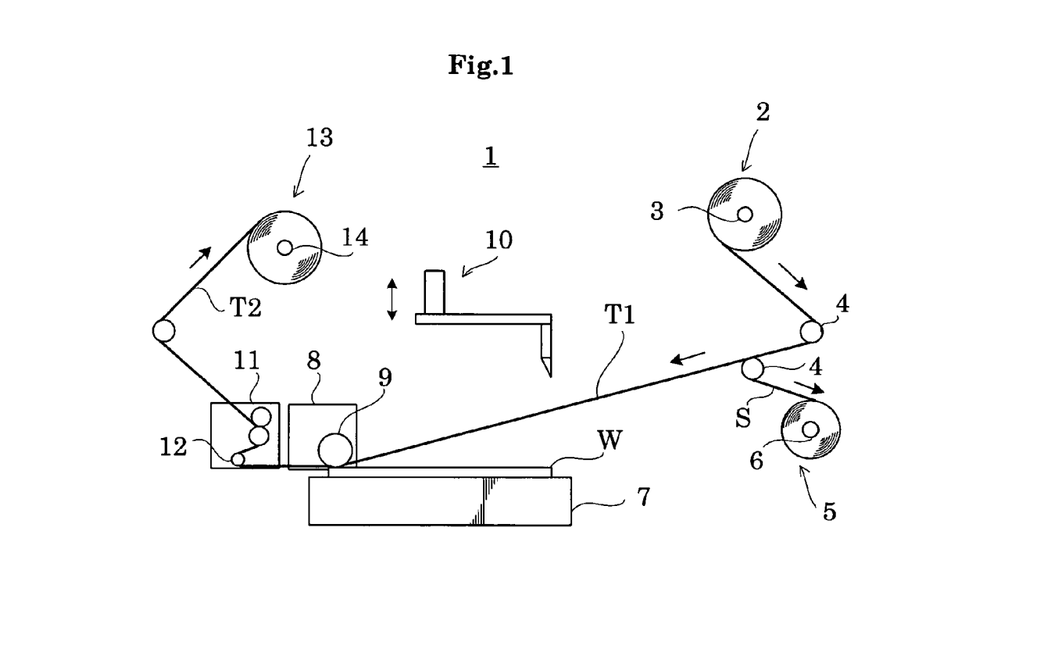
FIG. 1 is a front view showing an outline of a tape applying apparatus in a first embodiment.
Figure 2:
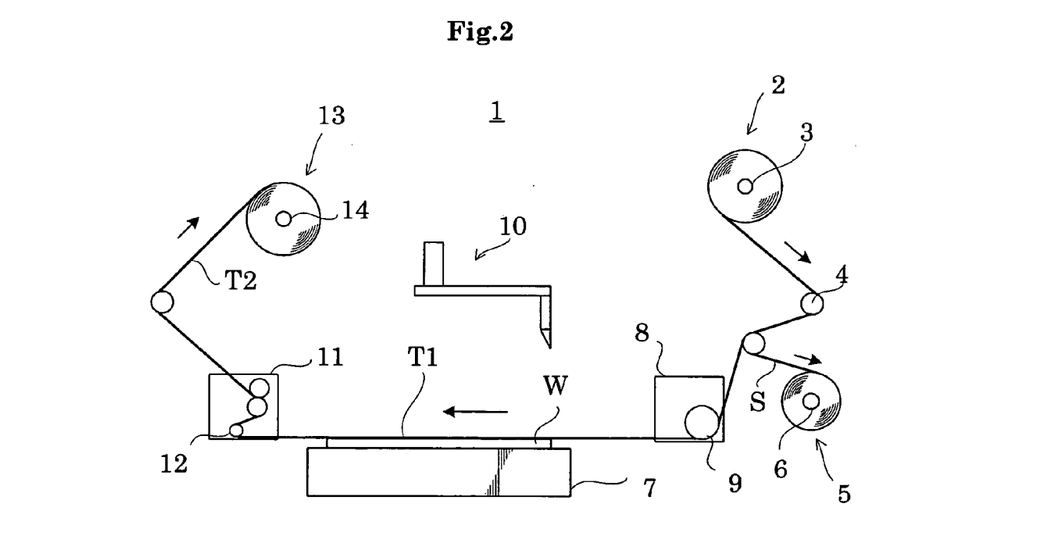
FIG. 2 is a schematic front view illustrating a tape applying process.
Figure 3:
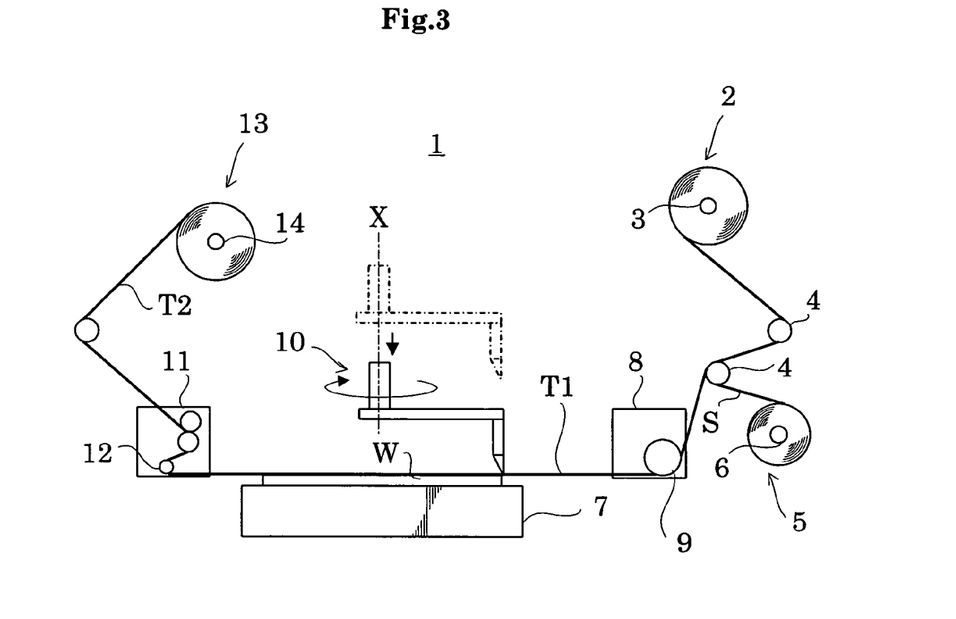
FIG. 3 is a schematic front view illustrating the tape applying process.
Figure 4:
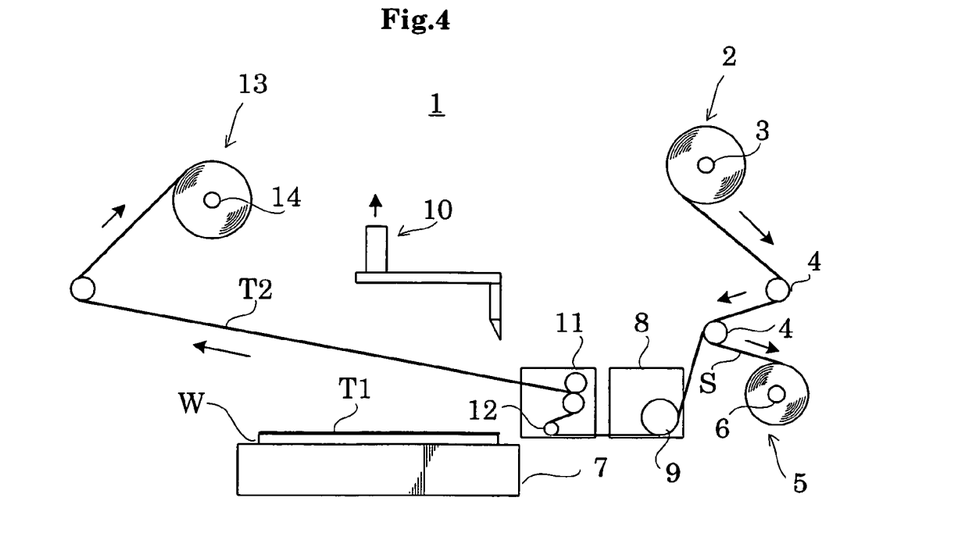
FIG. 4 is a schematic front view illustrating the tape applying process.

FIG. 1 is a front view showing an outline of a tape applying apparatus. FIGS. 2 through 4 are front views illustrating a tape applying process.

An apparatus 1 for applying protective tape to semiconductor wafers, in this embodiment, has a tape server 2 for supplying a protective tape T1 along with a separator S, a separator collector 5 for separating and collecting the separator S from the protective tape T1, a chuck table 7 for suction-supporting a semiconductor wafer W (hereinafter simply called "wafer W") thereon, a tape applying mechanism 8 for pressing and applying the protective tape T1 to the wafer W, a cutter unit 10 for cutting the protective tape T1 on the wafer W along the circumference of the wafer W, a tape separating mechanism 11 for separating residual tape T2 from the wafer W after the cutting, and a tape collector 13 for collecting the separated tape.

The construction of each mechanism will be described in detail hereinafter.

The tape server 2 is constructed to guide the protective tape T1 with separator S drawn from a tape bobbin 3 to move around on a group of guide rollers 4, and guide the protective tape T1 stripped of the separator S to the tape applying mechanism 8. The tape bobbin 3 is supported by a vertical wall of a main body of the apparatus, not shown, and is given an appropriate rotational resistance by a braking mechanism or the like to avoid an excessive tape feeding.

The separator collector 5 has a collecting bobbin 6 supported by the vertical wall, not shown, for winding the separator S separated from the protective tape T1, and driven by a driving device such as a motor to rotate in a winding direction.

The chuck table 7 has guide pins for adjusting position of the wafer W placed thereon with reference to an orientation flat or the like, while suction-supporting the wafer W at the back surface thereof.

The tape applying mechanism 8 has a frame thereof held by a rail of the main body of the apparatus and operatively connected to a driving device such as a motor not shown, to be slidable in a tape running direction. The frame rotatably supports an applicator roller 9. The applicator roller 9 is vertically swung by a cylinder or the like not shown. Thus, the applicator roller 9 applies the protective tape T1 to the surface of the wafer W while pressing and rolling on the surface of the protective tape T1.

The cutter unit 10 is vertically movable by a lift mechanism, not shown, between a standby position and a cutting position for cutting the protective tape T1, and is swivelable along the circumference of the wafer W to cut the protective tape T1.

The tape separating mechanism 11 has a frame thereof held by the rail of the main body of the apparatus and operatively connected to a driving device such as a motor not shown, to be slidable in the tape running direction. The frame rotatably supports a separator roller 12. The separator roller 12 is vertically swung by a cylinder or the like not shown. The separator roller 12 is provided to separate from the wafer W the residual tape T2 which is left thereon after the tape is cut along the circumference of the wafer W.

The tape collector 13 has a collecting bobbin 14 supported by the vertical wall of the main body of the apparatus not shown, and is operatively connected to a driving device such as a motor for winding the residual tape T2 remaining after the protective tape T1 is cut. That is, a predetermined quantity of protective tape T1 is drawn from the tape server 2 and fed onto the wafer W. The collecting bobbin 14 is driven by the driving device to wind up the residual tape T2 left after a cutting operation.

A method of applying protective tape in a plurality of plies will be described with reference to the drawings, using the tape applying apparatus having the above construction. In this embodiment, two tape applying apparatus are used to apply two different types of protective tape in a plurality of plies to the surface of each wafer.

The two types of protective tape used in this embodiment are as follows.

The first protective tape T1 applied directly to the surface of wafer W is the ultraviolet curable type with a substrate surface given a heavy separation treatment (release treatment) such as a corona treatment, and having an adhesive having a stronger adhesive strength than the adhesive of a second protective tape T2.

The second protective tape T3 used has a less adhesive strength than the first protective tape T1.

Each of the two types of tape T1 and T3 is in roll form laminated with the separator S.

Next, a cycle of operation for applying protective tape in a plurality of plies to the wafer W by using the above two types of protective tape T1 and T3 and the tape applying apparatus 1 will be described.

A first and a second tape applying apparatus are arranged side by side. The protective tape T1 is set on the tape bobbin 3 of the first tape applying apparatus and the protective tape T3 is set on the tape bobbin 3 of the second tape applying apparatus.

A wafer W is placed on, positionally adjusted to and suction-supported by the chuck table 7 of the first tape applying apparatus. At this point, as shown in FIG. 1, the tape applying mechanism 8 and tape separating mechanism 11 are in an initial position at the left side, and the cutter unit 10 in the upper standby position.

After the position of the wafer W is adjusted, the applicator roller 9 of the tape applying mechanism 8 is swung downward. Then the applicator roller 9 rolls in a direction opposite to the tape running direction (from left to right in FIG. 2.) while pressing down the protective tape T1. In this way, the protective tape T1 is applied uniformly over the surface of the wafer W. When the tape applying mechanism 8 reaches a terminal position, the applicator roller 9 is raised.

Next, as shown in FIG. 3, the cutter unit 10 is lowered to the cutting position to cut the protective tape T1, and is lowered to and stopped at a predetermined height with its edge piercing the protective tape T1. The cutter unit 10 lowered to the predetermined position is driven to swivel about a vertical axis X to cut the protective tape T1 along the circumference of the wafer. At this time, a predetermined tension is applied to the protective tape T1 by the tape applying mechanism 8 and tape separating mechanism 11.

After cutting out the protective tape T1, the cutter unit 10 is raised back to the standby position as shown in FIG. 4.

Next, as shown in FIG. 4, the tape separating mechanism 11 takes up and separates the residual tape T2 left on the wafer W while moving over the wafer W in the direction opposite to the tape running direction.

When the tape separating mechanism 11 reaches a terminal position for the separating operation, the tape separating mechanism 11 and the tape applying mechanism 8 are moved in the tape running direction back to the initial position shown in FIG. 1. In the meantime, the residual tape T2 is rolled up by the collecting bobbin 14, while a predetermined quantity of protective tape T1 is drawn from the tape server 2. This ends the operation for applying the protective tape T1 to the surface of the wafer W in the first tape applying apparatus.

The wafer W, with the protective tape T1 applied to the surface thereof in the first tape applying apparatus, is transferred to the second tape applying apparatus.

In the second tape applying apparatus, the wafer W is positionally adjusted on the chuck table, and then the same operation as in the above first tape applying apparatus is repeated to apply the second protective tape T3 over the first protective tape T1.

In time of this tape application, the roller 9 rolls while pressing the surface of the second protective tape T3, thereby applying the protective tape T3 to the surface of the first protective tape T. Thus, the wafer W has rigidity with the protective tapes T1 and T3 applied in plies thereto.

Wafers W with the two protective tapes applied in plies thereto are transported in a cassette to a back-grinding apparatus for a thinning process, for example. Thereafter the wafers W are again placed in a cassette and transported to a wafer alignment apparatus or the like.

When the cassette is loaded into a wafer mounting apparatus, for example, the wafers W are taken out of the cassette, one at a time, and transferred to an alignment stage by a robot arm.

Each wafer W transferred to the alignment stage is aligned based on the orientation flat or the like. After the alignment, an ultraviolet irradiating unit descends from a standby position above the alignment stage AS and emits ultraviolet light toward the wafer W.

The ultraviolet irradiation cures the adhesive of protective tape T1, and by its anchoring effect it bonds more firmly to the surface of the wafer W than the second protective tape T3.

Figure 5:
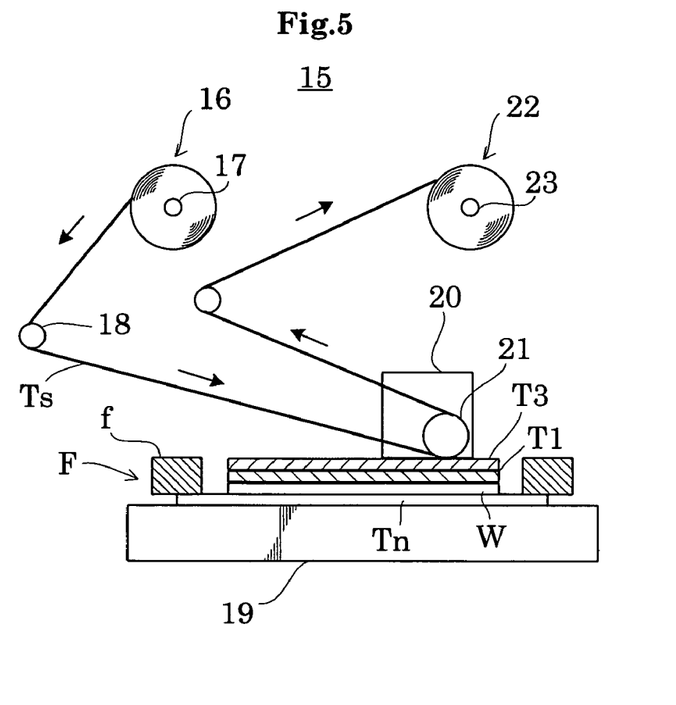
FIG. 5 is a front view showing an outline of a tape separating apparatus according to the embodiment.

The wafer W having undergone the ultraviolet irradiating process is transported to a mount frame preparing unit, to be supported in a state when the wafer W is placed for the separating step shown in FIG. 5, i.e. by a ring-shaped frame f by means of adhesive tape Tn applied to the back surface. The wafer W supported by the ring-shaped frame f (hereinafter simply called "mount frame F") is transported to the separating step and is placed on a chuck table 19 in FIG. 7 to be described hereinafter.

As described above, the ultraviolet curable protective tape T1 with strong adhesion may be applied to the surface of wafer W, and the protective tape T3 of weaker adhesion applied to the surface of the protective tape T1. That is, protective tape may be applied in a plurality of plies with the protective tape of weak adhesion forming the upper part. Thus, the protective tapes may easily be applied in a plurality of plies by using conventional apparatus. Further, by applying protective tape in a plurality of plies to the surface of wafer W, rigidity is given to the wafer W to avoid damage in time of thinning process for grinding the back face surface.

A protective tape separating method will be described next.

A protective tape separating apparatus for executing the protective tape separating method in this embodiment will be described first with reference to the drawings.

FIG. 5 is a front view showing an outline of the tape separating apparatus. FIGS. 6 through 9 are explanatory views illustrating a protective tape separating process.

An apparatus 15 for separating protective tape from semiconductor wafers, in this embodiment, has a tape server 16 for supplying a separating tape Ts, a chuck table 19 for suction-supporting a mount frame F, a separating mechanism 20 for pressing and applying the separating tape Ts to the protective tape T3 applied over the surface of the wafer W and separating the separating tape Ts together with the protective tape T3, and a tape collector 22 for collecting both tapes separated from the wafer W.

The construction of each mechanism will be described in detail hereinafter.

The tape server 16 is constructed to guide the separating tape Ts drawn from a tape bobbin 17 to the separating mechanism 20 by way of a guide roller 18. The tape bobbin 17 is supported by a vertical wall of a main body of the apparatus, not shown, and is given an appropriate rotational resistance by a braking mechanism or the like to avoid an excessive tape feeding.

The chuck table 19 has guide pins for adjusting position of the mount frame F transferred thereto, and is constructed to support the back surface thereof by suction. Further, the chuck table 19 has a frame thereof held by a rail of the main body of the apparatus and operatively connected to a driving device not shown, to be slidable in a running direction of the separating tape Ts.

The separating mechanism 20 has a separator roller 21 rotatably supported by a frame thereof. The separator roller 21 is vertically swung by a cylinder or the like not shown. That is, the roller is operable to press and apply the separating tape Ts to the surface of the protective tape T3.

The tape collector 22 has a collecting bobbin 23 supported by the vertical wall of the main body of the apparatus not shown, and operatively connected to a driving device such as a motor not shown, for taking up the tapes separated together, with the separating tape Ts applied to the surface of the protective tape T3. That is, a predetermined quantity of separating tape Ts is drawn from the tape server 16 and fed onto the wafer W. The collecting bobbin 23 is driven by the driving device to wind up the separating tape Ts joined with the protective tape T3.

Next, a method of separating, from the mount frame F, the protective tape applied in a plurality of plies by using the foregoing protective tape applying apparatus 1 and joined with the ring-shaped frame f, will be described with reference to the drawings, using the tape separating apparatus 15 having the above construction. That is, of the two protective tapes, the second protective tape T3 is of weaker adhesion than the first protective tape T1.

First, the mount frame F is placed on the chuck table 19 as shown in FIG. 5.

Figure 6:
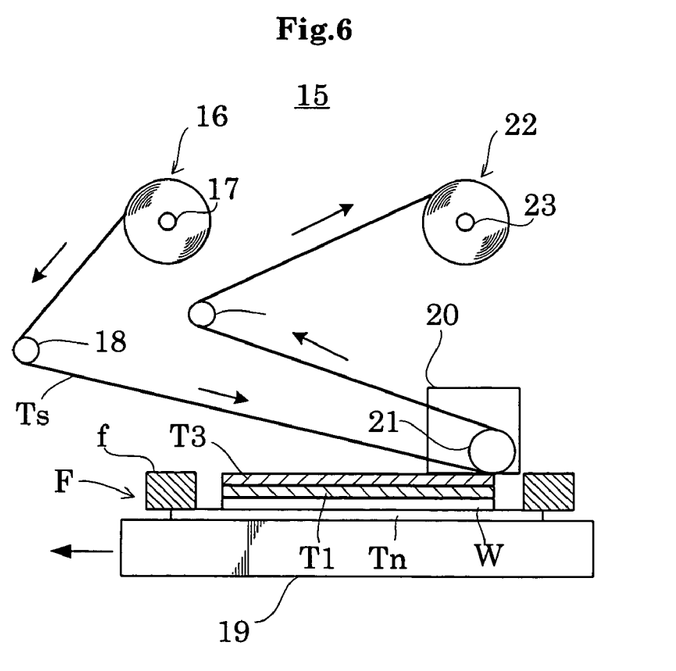
FIG. 6 is a schematic front view illustrating a tape separating process.

The mount frame F placed is positionally adjusted and suction-supported. Then, as shown in FIG. 6, the chuck table 19 is moved (leftward in the figure) to a position having the separator roller 21 in contact with a peripheral portion of the wafer W.

Figure 7:
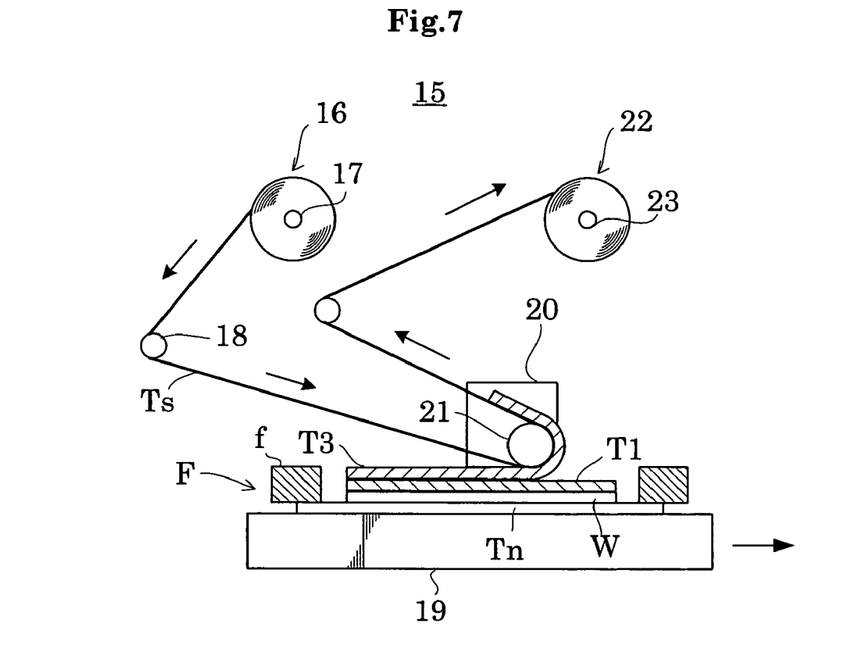
FIG. 7 is a schematic front view illustrating the tape separating process.

After the position of the mount frame F is adjusted, as shown in FIG. 7, the separator roller 21 is swung down and the chuck table 19 is moved in the running direction of the separating tape Ts. With the movement of the chuck table 19, the separator roller 21 rolls over the wafer W pressing the separating tape Ts thereon. That is, the separating tape Ts is applied to the uppermost protective tape T3, and the protective tape T3 with the separating tape Ts adhering thereto is separated from the surface of the protective tape T1 and taken up with the separating tape Ts.

At this time, only the protective tape T3 is first separated from the surface of the protective tape T1 since the adhesive-contacting of the protective tape T1 has been given release treatment and the lower protective tape T1 has a stronger adhesion than the protective tape T3.

Figure 8:
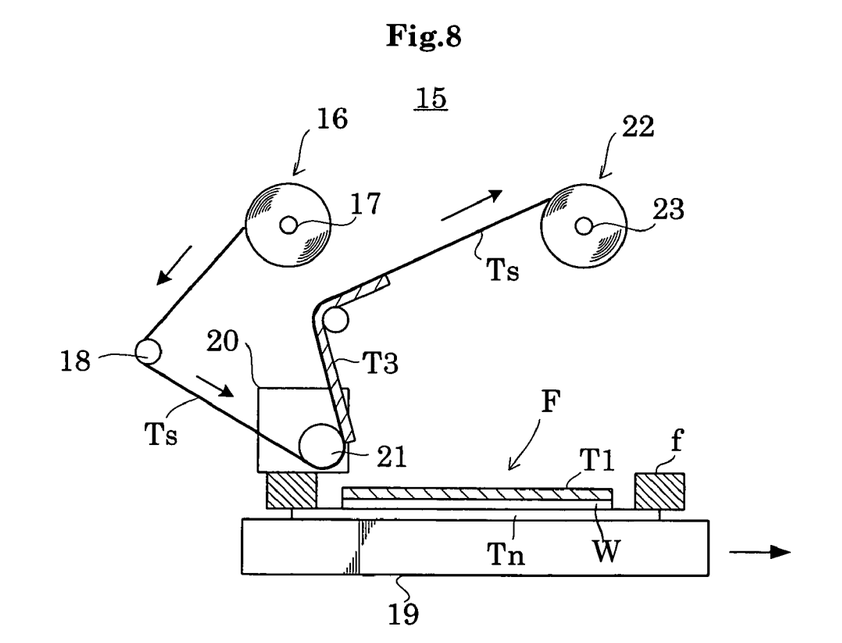
FIG. 8 is a schematic front view illustrating the tape separating process.

When the chuck table 19 reaches a terminal position shown in FIG. 8, the separator roller 21 is moved upward and the chuck table 19 is moved counter to the tape running direction back to the initial position. In the meantime, the protective tape T3, which is joined and separated with the separating tape Ts, is wound up around the collecting bobbin 23, while a predetermined quantity of separating tape Ts is drawn from the tape server 16.

Figure 9:
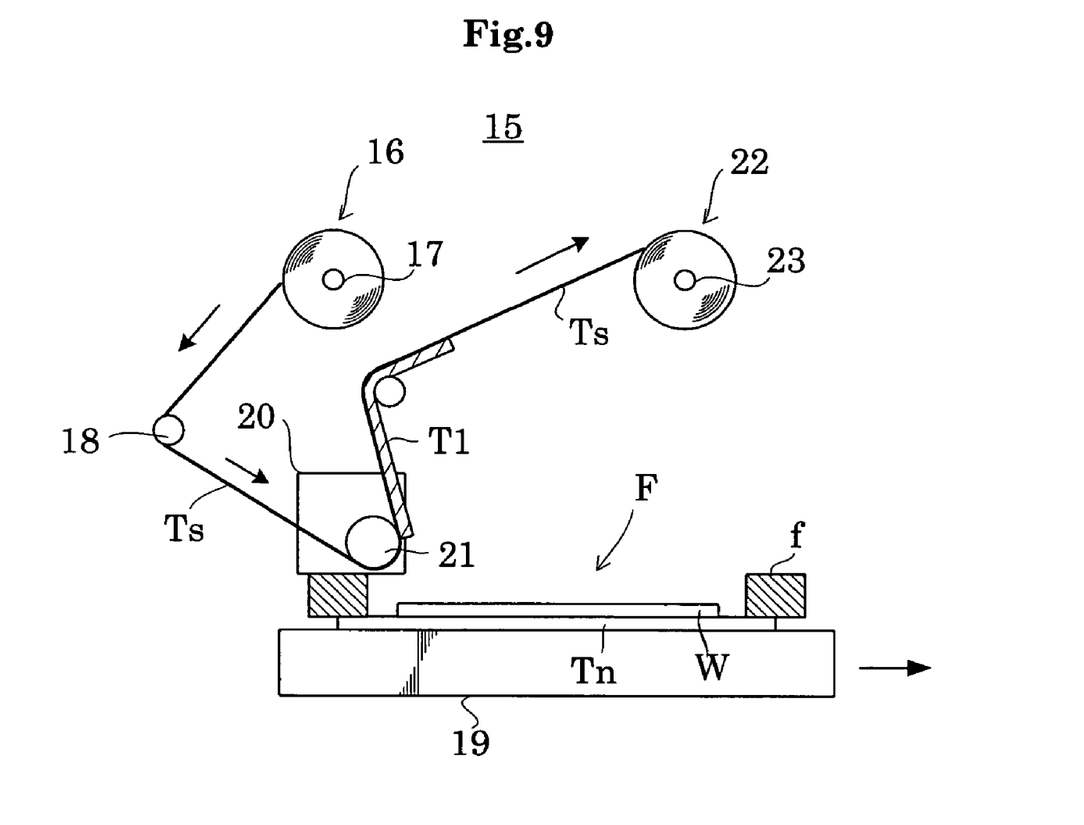
FIG. 9 is a schematic front view illustrating the tape separating process.

This ends the operation for separating one protective tape. The same operation is carried out for the lower protective tape T1. Consequently, as shown in FIG. 9, the lower protective tape T1 may also be separated from the surface of the wafer W, which completes an entire separating operation.

As described above, protective tapes are applied in a plurality of plies with the upper protective tape having a weaker adhesion than the lower protective tape, and a thinning process is performed. Subsequently, the protective tapes are separated in order, one after another, starting with the upper tape. Thus, the wafer W is free from the stress due to a strong pulling force as in the prior art in which a plurality of protective tapes are separated from the surface of wafer W at a time. Specifically, when separating the upper protective tape, the rigidity of wafer W is secured by the lower protective tape. Consequently, the wafer W is never damaged in time of protective tape separation.

This invention is not limited to the foregoing embodiment, but may be modified as follows:

(1) The above protective tape applying method has been described by taking the case of applying two protective tapes for example. Two or more tapes may be applied in a plurality of plies. Regarding the type of protective tapes applied in a plurality of plies, the protective tapes may be the same type where the one having weak adhesion is placed above, with release treatment given to the adhesive-contacting surfaces of the protective tapes, and the protective tapes are easily separable from the surfaces. Further, the protective tapes are not limited to the ultraviolet curable type.

(2) The protective tapes in sheet form are fed from stock rolls, and applied in plies while cutting out along the circumference of wafer W. The tapes may be cut to the shape of the wafer in advance, and repeatedly applied individually. The tapes may be superimposed together before application, and cut by the cutter unit 10.

(3) In the above protective tape separating method, the chuck table 19 is movable in the tape running direction. Instead, the separating mechanism 20 itself may be adapted movable in the tape running direction.

(4) The above protective tape separating method has been described by taking the mount separation for example, where the protective tapes are separated after wafer mounting. The mount separation is not limitative. Protective tapes applied in plies to the surface of a wafer not supported by a mount frame may be separated.

INDUSTRIAL UTILITY

The protective tape applying and separating method according to this invention, as described above, is well suited for separating protective tape from semiconductor wafers with high precision.

The invention claimed is:

1. A protective tape applying and separating method for applying protective tape to a surface of a semiconductor wafer with a pattern formed thereon, and separating the protective tape from the surface of the semiconductor wafer, said protective tape applying and separating method being characterized by comprising:
   an applying step for applying a plurality of protective tapes in plies to the surface of said semiconductor wafer such that a protective tape with weak adhesion lies on top; and
   a separating step for applying a separator tape over said protective tapes applied in plies, and separating the protective tapes in plies one by one, the upper one first, from the surface of said semiconductor wafer by means of the separator tape.

2. A protective tape applying and separating method as defined in claim 1, characterized in that said protective tapes applied to the surface of the semiconductor wafer comprise a plurality of protective tapes bonded together in plies as a unit beforehand.

3. A protective tape applying and separating method as defined in claim 2, characterized in that said protective tapes are in sheet form, said protective tapes being first applied to the semiconductor wafer, and thereafter cut approximately to the shape of the semiconductor wafer.

4. A protective tape applying and separating method as defined in claim 2, characterized in that said protective tapes are cut approximately to the shape of the semiconductor wafer beforehand.

5. A protective tape applying and separating method as defined in claim 1, characterized in that said protective tapes in plies are a plurality of protective tapes applied individually and repeatedly.

6. A protective tape applying and separating method as defined in claim 5, characterized in that said protective tapes are in sheet form, said protective tapes being first applied to the semiconductor wafer, and thereafter cut approximately to the shape of the semiconductor wafer.

7. A protective tape applying and separating method as defined in claim 5, characterized in that said protective tapes are cut approximately to the shape of the semiconductor wafer beforehand.

8. A protective tape applying and separating method as defined in claim 1, characterized in that said protective tapes in plies have adhesive-contacting surfaces given release treatment.

9. A protective tape applying and separating method as defined in claim 8, characterized in that said protective tapes are in sheet form, said protective tapes being first applied to the semiconductor wafer, and thereafter cut approximately to the shape of the semiconductor wafer.

10. A protective tape applying and separating method as defined in claim 8, characterized in that said protective tapes are cut approximately to the shape of the semiconductor wafer beforehand.

11. A protective tape applying and separating method for applying protective tape to a surface of a semiconductor wafer with a pattern formed thereon, and separating the protective tape from the surface of the semiconductor wafer, said protective tape applying and separating method being characterized by comprising:
    an applying step for applying a plurality of protective tapes of the same type with adhesive-contacting surfaces given release treatment, in plies to the surface of said semiconductor wafer; and
    a separating step for applying a separator tape over said protective tapes applied in plies, and separating the protective tapes in plies one by one, the upper one first, from the surface of said semiconductor wafer by means of the separator tape.

12. A protective tape applying and separating method as defined in claim 11, characterized in that said protective tapes applied to the surface of the semiconductor wafer comprise a plurality of protective tapes bonded together in plies as a unit beforehand.

13. A protective tape applying and separating method as defined in claim 12, characterized in that said protective tapes are in sheet form, said protective tapes being first applied to the semiconductor wafer, and thereafter cut approximately to the shape of the semiconductor wafer.

14. A protective tape applying and separating method as defined in claim 12, characterized in that said protective tapes are cut approximately to the shape of the semiconductor wafer beforehand.

15. A protective tape applying and separating method as defined in claim 11, characterized in that said protective tapes in plies are a plurality of protective tapes applied individually and repeatedly.

16. A protective tape applying and separating method as defined in claim 15, characterized in that said protective tapes are in sheet form, said protective tapes being first applied to the semiconductor wafer, and thereafter cut approximately to the shape of the semiconductor wafer.

17. A protective tape applying and separating method as defined in claim 15, characterized in that said protective tapes are cut approximately to the shape of the semiconductor wafer beforehand.

* * * * *